(12) United States Patent
Chou et al.

(10) Patent No.: US 11,854,870 B2
(45) Date of Patent: Dec. 26, 2023

(54) ETCH METHOD FOR INTERCONNECT STRUCTURE

(71) Applicant: Taiwan Semiconductor Manufacturing Company, Ltd., Hsinchu (TW)

(72) Inventors: Chun-Cheng Chou, Taichung (TW); Yu-Fang Huang, Hsinchu (TW); Kuo-Ju Chen, Taichung (TW); Ying-Liang Chuang, Zhubei (TW); Chun-Neng Lin, Hsinchu (TW); Ming-Hsi Yeh, Hsinchu (TW); Kuo-Bin Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 177 days.

(21) Appl. No.: 17/461,001

(22) Filed: Aug. 30, 2021

(65) Prior Publication Data

US 2023/0067300 A1 Mar. 2, 2023

(51) Int. Cl.
| | |
|---|---|
| *H01L 21/768* | (2006.01) |
| *H01L 23/522* | (2006.01) |
| *H01L 23/532* | (2006.01) |
| *H01L 21/3215* | (2006.01) |

(52) U.S. Cl.
CPC .... *H01L 21/76805* (2013.01); *H01L 21/7685* (2013.01); *H01L 21/76867* (2013.01); *H01L 23/5226* (2013.01); *H01L 21/3215* (2013.01); *H01L 23/53257* (2013.01)

(58) Field of Classification Search
CPC .......... H01L 21/76805; H01L 21/7685; H01L 21/76867; H01L 21/3215; H01L 23/5226; H01L 23/53257; H01L 21/32134; H01L 21/76834; H01L 21/76886; H01L 23/53209; H01L 21/768; H01L 23/522
See application file for complete search history.

(56) References Cited

U.S. PATENT DOCUMENTS

| | | | | |
|---|---|---|---|---|
| 2009/0273086 A1* | 11/2009 | Bartsch | ............. | H01L 21/76834 |
| | | | | 257/E23.142 |
| 2018/0342420 A1* | 11/2018 | You | .................. | H01L 21/76843 |
| 2019/0304833 A1* | 10/2019 | Chen | ................ | H01L 21/76814 |
| 2019/0304834 A1* | 10/2019 | Wang | ................ | H01L 21/32134 |

\* cited by examiner

*Primary Examiner* — Syed I Gheyas
*Assistant Examiner* — Vicki B. Booker
(74) *Attorney, Agent, or Firm* — FOLEY & LARDNER LLP

(57) ABSTRACT

A method for making a middle-of-line interconnect structure in a semiconductor device includes forming, near a surface of a first interconnect structure comprised of a first metal, a region of varied composition including the first metal and a second element. The method further includes forming a recess within the region of varied composition. The recess laterally extends a first distance along the surface and vertically extends a second distance below the first surface. The method further includes filling the recess with a second metal to form a second interconnect structure that contacts the first interconnect structure.

16 Claims, 4 Drawing Sheets

ETCH METHOD FOR INTERCONNECT STRUCTURE

BACKGROUND

A commonly used semiconductor fabrication process for fabricating middle-of-line interconnects in a semiconductor device is through formation of a plug, for example, according to an ultimate plug scheme (UPS). To achieve a lower contact resistance $R_c$ of the plug, a glue layer is forgone. Planarization, during which the surface of the semiconductor device undergoes a smoothing process such as chemical-mechanical polishing, may occur directly after deposition of the plug to provide a smooth surface on which to continue the fabrication process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
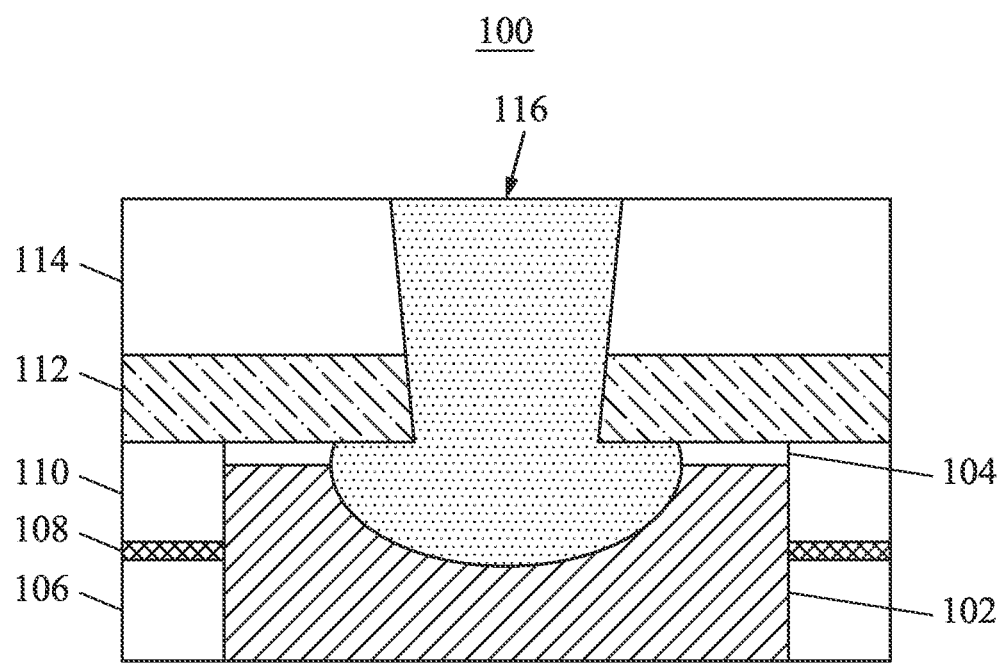
FIG. 1 illustrates a cross-sectional view of a middle-of-line interconnect structure in a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and more particularly, in the context of forming conductive interconnect features in semiconductor devices. Upon forming conductive features (e.g., source/drain features and metal gates), interconnect features (e.g., contacts and/or vias, metal lines, metallization layers, and inter-dielectric layers) can be formed through multiple patterning and etching processes to further device fabrication. One such structure is a vertical middle-of-line interconnect structure in a semiconductor device.

In some embodiments, the interconnect structure is formed from a semiconductor device having a first interconnect structure formed of a first metal, such as cobalt (Co). The first interconnect structure has a first horizontal top surface along which a dopant-type element, such as germanium (Ge) is distributed using a method such as ion implantation. The ion implantation may occur before or after deposition of a dielectric layer on the top surface of the first interconnect structure, such as a metal-contact-etch-stop-contact layer (MCESL) or a layer formed of silicon nitride ($Si_3N_4$). After Ge implantation, a first etch of the dielectric layer is performed to form a via selectively exposing a portion of the top surface of the Co interconnect structure. Next, a second etch is performed on the first interconnect structure during which Co is converted into CoFx and washed away by water, forming a rivet-shaped recess in the first interconnect structure. Next, a second interconnect structure formed of a second metal, such as tungsten (W) is deposited in the rivet-shaped recess in contact with the first interconnect structure and in the via formed in the dielectric layer and/or MCESL during the first etch, such that the second interconnect structure includes a first portion disposed above the horizontal top surface of the first interconnect structure and a second portion disposed below the horizontal top surface and laterally extending beyond sidewalls of the first portion.

In interconnects lacking a glue layer such as that described above, the interconnect plug can experience poor adhesion to the side walls of the via in which it is formed. In such cases, when the semiconductor wafer undergoes planarization such as chemical-mechanical polishing, the via may experience slurry leakage in which slurry used for polishing penetrates the semiconductor device in a crevice formed between the plug and the via, exposing the cobalt layer to slurry penetration. This often results in material loss of the interconnect layer (e.g., cobalt layer). In some cases, such penetration may cause the plug to pull-up and break away from the semiconductor device entirely. This problem can be addressed using an isotropic etch (e.g., dry and/or wet etch) to form a rivet-shaped profile in which an interconnect metal (e.g., tungsten) is deposited to form a knob to secure the interconnect in place.

In the above method, the lateral etch rate experienced by the interconnect layer during isotropic etching is not always sufficient to form a rivet profile that can effectively prevent slurry leakage and pull-up from the device. One solution to decrease the amount of pull-up instances would be to enlarge the lateral profile of the knob. However, as features sizes continue to decrease, enlargement of the knob profile in an isotropic etch (e.g., an etch in which the etch rate is the same in all directions) runs the risk of unintentional punch through the interconnect layer and damaging the underlying epitaxial layer or electrical contact layer (e.g., such as $TiSi_2$). By adding a second element as a dopant to the interconnect layer (e.g., germanium to the cobalt layer), the etch characteristics of the interconnect layer differ in the implanted region deposited horizontally along the top surface of the interconnect layer from the rest of the interconnect layer. The variation in etch characteristics enables the semiconductor device to undergo anisotropic etching to achieve an enlarged lateral etch without effecting the vertical etch, thereby preserving the integrity of the interconnect layer.

FIG. 1 illustrates an example structure of a middle-of-line interconnect 100 in a semiconductor device, in accordance with various embodiments. Interconnect 100 includes a first interconnect structure 102 and a region of varied composition 104 formed along a horizontal top surface of first interconnect structure 102. First interconnect structure 102 may be formed of a metal suitable for interconnects, such as cobalt (Co) or copper (Cu). Region of varied composition 104 may be formed through ion implantation of a dopant-type element such as germanium (Ge) implanted along the top surface of first interconnect structure 102. First interconnect structure 102 may be disposed in a via formed in a series of layers, including interlayer dielectric (ILD) layers 106 and 110 in between which an etch stop layer 108 is disposed. ILD layers 106 and 110 may be formed of dielectric materials such as low-k dielectric materials or otherwise insulating materials to electrically insulate first interconnect structure 102 from other interconnect structures (not shown) in the same or adjacent metallization layers.

On the top surface of first interconnect structure 102, a metal contact etch stop layer (MCESL) 112 may be formed to provide etching protection to the underlying first interconnect structure 102, thereby allowing more selective etching of first interconnect structure 102 when exposed. MCESL 112 may be formed of a metal compound or a substance including a metal compound. On a top surface of MCESL 112, an ILD layer 114 may be formed to provide insulation for a second interconnect structure 116 formed to contact first interconnect structure 102. ILD layer 114 may be formed of a material substantially similar to that of ILD layers 106 and 110. Second interconnect structure 116 is disposed within a via formed in ILD layer 114 and MCESL 112. Second interconnect structure 116 is formed of a second metal, such as tungsten, and is electrically connected to first interconnect structure 102. Second interconnect structure 116 may be formed by a deposition process such as sputtering or the like.

Semiconductor device 100 may be included in a microprocessor, a memory, and/or other integrated circuit device. Semiconductor device 100 may be a portion of an IC chip, a system on a chip (SoC), or portion thereof that includes various passive and active microelectronics devices such as resistors, capacitors, inductors, diodes, MOSFET, complementary metal-oxide semiconductors (CMOS) transistors, bipolar junction transistors (BJTs), laterally diffused MOS (LDMOS) transistors, high voltage transistors, high frequency transistors, other suitable components, or combinations thereof.

Figure 2:
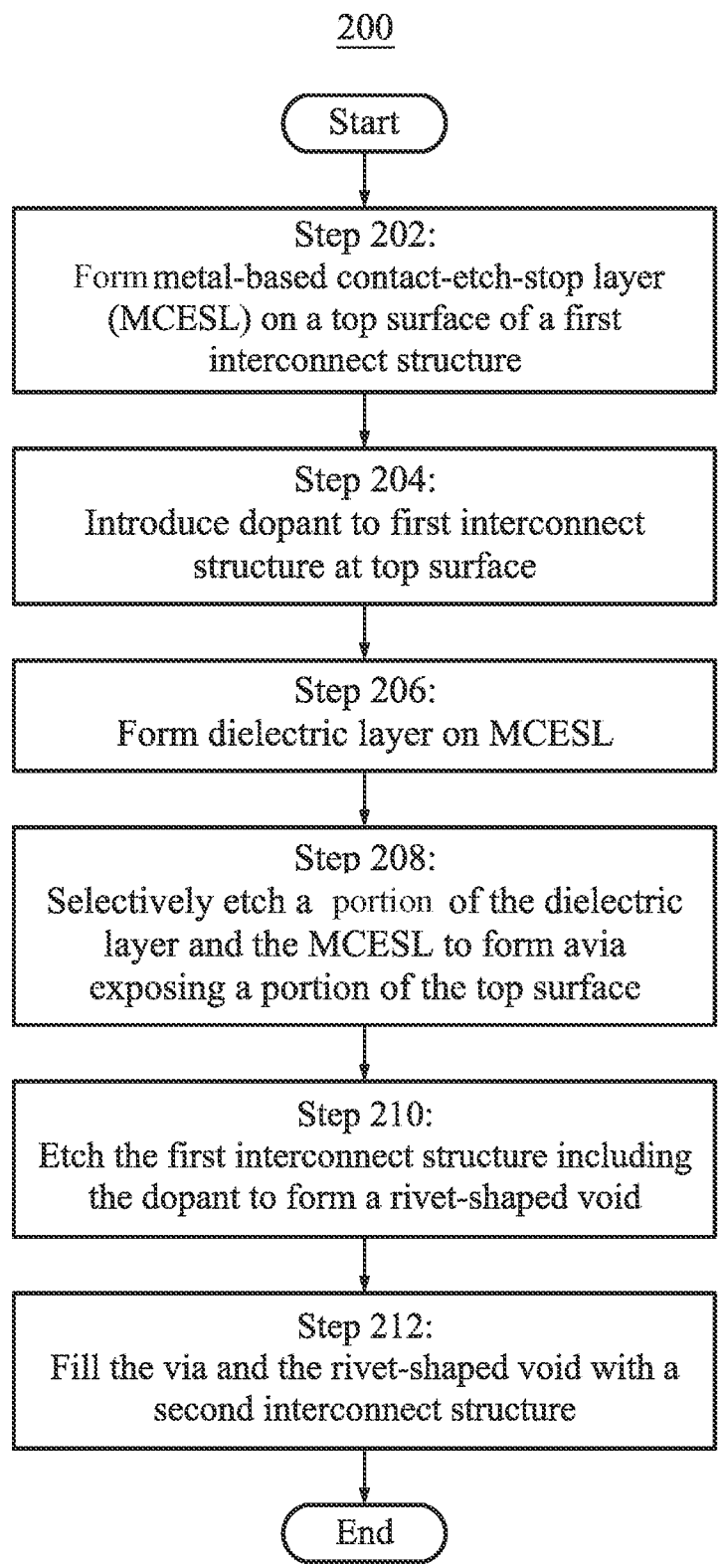
FIG. 2 illustrates a flow chart of an example method for fabricating the middle-of-line interconnect structure of FIG. 1, in accordance with some embodiments.

FIG. 2 illustrates a flow chart of a method 200 to form a middle-of-line interconnect in a semiconductor device according to one or more embodiments of the present disclosure. FIGS. 3A through 3F illustrate cross-sectional views of the middle-of-line interconnect during various fabrication stages made by method 200, in accordance with various embodiments. For ease of description, each step of method 200 will be described with reference to the corresponding cross-sectional view of FIGS. 3A through 3F. It is noted that the method 200 is merely an example, and is not intended to limit the present disclosure. Accordingly, it is understood that additional steps may be provided before, during, and after the method 200 of FIG. 2, and that some other operations may only be briefly described herein.

Method 200 starts with a step 202, in which a metal contact-etch-stop layer (MCESL) is formed on a top surface of a first interconnect structure. Step 202 can correspond to the cross-sectional view of FIG. 3A, in accordance with various embodiments. As shown, a semiconductor device 300 having a first interconnect structure 302 formed of a first metal such as cobalt (Co) undergoes a process in which a MCESL 304 is formed on a top surface 306 of first interconnect structure 302. MCESL 304 may be formed of silicon nitride, although other materials such as nitride, oxynitride, carbide, boride, or combinations thereof may be used. MCESL 304 is deposited directly on a top surface of first interconnect structure 302 to provide protection from etching by slowing etching processes. MCESL 304 is composed of a material generally having greater resistance to chemical etching (dry and/or wet etching), and therefore enables any exposure of top surface 306 of first interconnect structure 302 to occur with greater selectivity, such that only a particular portion is purposefully exposed during etching.

Method 200 continues with a step 204, in which a dopant is introduced to top surface of the first interconnect structure. Step 204 can correspond to the cross-sectional view of FIG. 3B, in accordance with various embodiments. As seen, a dopant 310 represented by a set of arrows indicating ion implantation to form a region of varied composition 308 near top surface 306 of first interconnect structure 302. In some embodiments, dopant 310 is an element such as germanium (Ge) or a similar element. To obtain Ge ions, a gas such as $GeF_4$ is used to form a Ge plasma, and the Ge ions are implanted to a concentration between about 5e14 $cm^{-3}$ and about 2e15 $cm^{-3}$. Dopant 310 is implanted to a depth about equal to or greater than the vertical height of MCESL 304 such that dopant 310 is distributed along top surface 306 to form region 308 between MCESL 304 and first interconnect structure 302. When dopant 310 is implanted, the etch characteristics of first interconnect structure 302 are altered along top surface 306.

Method 200 continues with a step 206, in which a dielectric layer is formed on a top surface of the MCESL. Step 206 can correspond to the cross-sectional view of FIG. 3C, in accordance with various embodiments. As shown, dielectric layer 312 is shown to be formed on a top surface of MCESL 304. Dielectric layer 312 may be an interlayer dielectric material including a suitable material such as un-doped silicate glass, or doped silicon oxide such as borophosphosilicate glass (BPSG), fused silica glass (FSG), phosphosilicate glass (PSG), boron doped silicon glass (BSG), low-k dielectric material and/or other suitable dielectric materials such as an oxide, a nitride, a carbide, an oxynitride, other suitable dielectric material, or combinations thereof. In the present embodiment dielectric layer 312 includes silicon oxide, silicon nitride, silicon carbide, silicon oxynitride, other suitable silicon-containing materials, or combinations thereof, more specifically $Si_3N_4$. Dielectric layer 312 is formed using any suitable method such as spin-on coating, flowable CVD, CVD, PVD, other suitable methods, or combinations thereof. Dielectric layer 312 is substantially similar in form and function to ILD layer 114 depicted in FIG. 1.

Method 200 continues with a step 208, in which a portion of the dielectric layer and the MCESL are selectively etched to form a via (e.g., a plug-shaped void) exposing a portion of the top surface of the first interconnect. Step 208 can correspond to the cross-sectional view of FIG. 3D, in accordance with various embodiments. As shown, a via 314 is formed in a region of MCESL 304 and ILD layer 312 to expose a portion of top surface 306 in which region of varied composition 308 is present. Via 314 is formed through a selective etching process such as a chemical etch (dry and/or wet etch) that removes a portion of ILD layer 312 and MCESL 304 to expose region of varied composition 308 in first interconnect structure 302. The etching process may include wet etching, dry etching, reactive ion etching (RIE), or other suitable etching methods. In some embodiments, step 208 may employ two etching techniques, one for ILD layer layer 312 and one for MCESL layer 304.

In some embodiments, step 208 includes a series of patterning processes that takes place prior to etching of the dielectric layer and the MCESL. The patterning processes may include forming a resist layer (e.g., a photo-resist layer; not shown), which may further include one or more underlying layers (e.g., hard mask layer and/or a bottom anti-reflective coating (BARC) layer), exposing the photoresist layer, baking the exposed resist layer, developing the exposed resist layer, and subsequently etching the underlying layers using the patterned resist layer as an etch mask. In some embodiments, a hard mask layer is formed over a top surface of the dielectric layer (e.g., ILD layer 312) prior to forming the patterned photoresist layer. The hard mask layer may be a nitride-containing layer such as titanium nitride. After etching, the patterned photoresist layer may be subsequently removed using any suitable method such as plasma ashing.

Method 200 continues with a step 210, in which the first interconnect structure including the dopant is etched to form a rivet-shaped void. Step 210 can correspond to the cross-sectional view of FIG. 3E, in accordance with various embodiments. As shown a rivet-shaped void 316 is shown to be formed in first interconnect structure 302 and region of varied composition 308 below the top surface 306 of first interconnect structure 302. During step 210, an etching process such as wet etching, dry etching, reactive ion etching (RIE), or another suitable etching method may be used to form rivet-shaped void 316. In the embodiment of FIGS. 2 and 2E, the etching method is a wet etch process in which the cobalt of first interconnect structure 302 is converted into CoFx, which dissolves in water, using hydrofluoric acid (HF) or the like.

The region of varied composition 308 alters the etch rate in the lateral direction along top surface 306 with dopant 310 (FIG. 3B) present. In various embodiments, with dopant 310 present, the region of varied composition 308 may present a higher etch rate. Further, as dopant 310 is present along top surface 306 with a relatively shallow depth (rather than penetrating into first interconnect structure 302 with a deep depth), the etch amount can be largely confined along top surface 306. Alternately stated, the etch amount along the lateral direction can significantly increase, while the etch amount along the vertical direction barely changes. As a non-limiting example, with a concentration of dopant 310 at about $5e14$ $cm^{-3}$, the etch amount (within the same time window) in the lateral direction can increase to about 25~28 angstroms (Å) from about 10~12 (Å) in which no dopant 310 is present. As another non-limiting example, with a concentration of dopant 310 at about $1e15$ $cm^{-3}$, the etch amount (within the same time window) in the lateral direction can increase to about 22~24 angstroms (Å) from about 1~12 (Å) in which no dopant 310 is present. In various embodiments, such as an increased etch rate (i.e., an increased etch amount within a certain time window) may occur in region of varied composition 308. As such, the lateral etch occurs at a significantly faster rate than the vertical etch, resulting in a rivet-shaped void 316 that extends in the lateral direction with a distance greater than a distance with which it extends in the vertical direction. For example, rivet-shaped void 316 can extend along the lateral direction with a first distance of about 10 nanometers (nm), and extend along the vertical direction with a second distance of about 8 (nm).

Figure 3A:
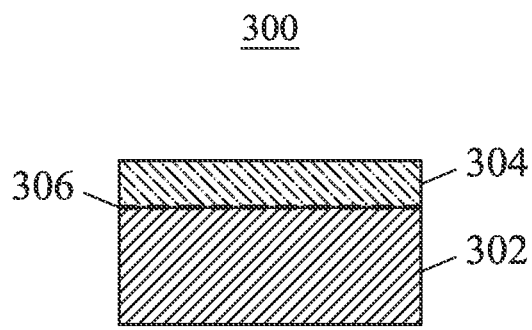
FIGS. 3A, 3B, 3C, 3D, 3E, and 3F illustrate cross-sectional views of an example semiconductor device (or a portion of the example semiconductor device) during various fabrication stages made by the method of FIG. 2, in accordance with some embodiments.
Figure 3B:
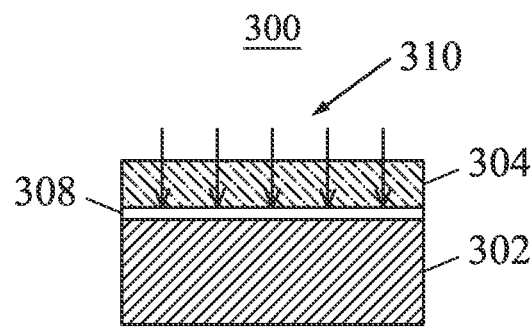
Figure 3C:
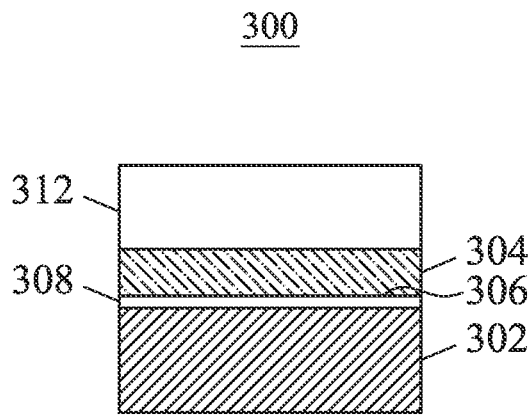
Figure 3D:
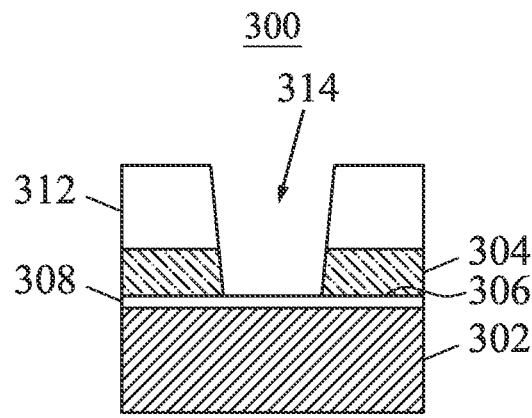
Figure 3E:
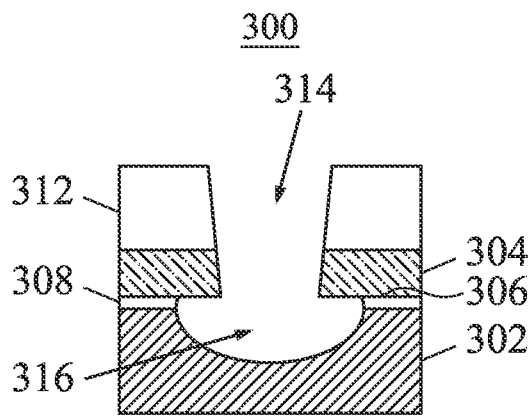

It can be seen from FIG. 3E that during steps 208 and 210, the etching of via 314 and rivet-shaped void 316 form a knob-shaped void disposed to be in contact with first interconnect structure 302. Method 200 continues with a step 212, in which the via and the rivet-shaped void are filled with a second interconnect structure (e.g., a conductive feature configured to contact the first interconnect structure) such that the second interconnect structure extends from the first interconnect layer through the region of varied composition, the MCESL, and the dielectric layer. The second interconnect structure contacts the first interconnect structure such that an electrical signal may pass from the first interconnect structure to the second interconnect structure and vice versa.

Figure 3F:
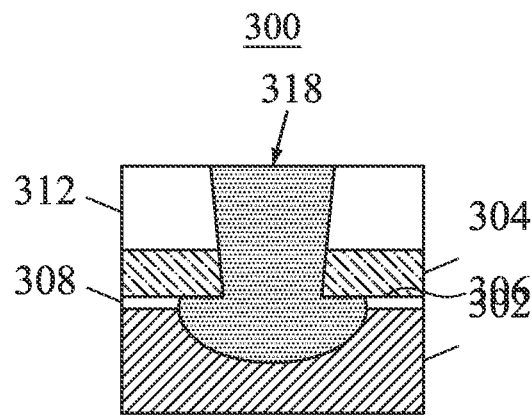

Step 212 can correspond to the cross-sectional view of FIG. 3F, in accordance with various embodiments. As shown, in which via 314 and rivet-shaped void 316 are replaced by a second interconnect structure 318. Second interconnect structure 318 is formed of a conductive material such as aluminum (Al), titanium (Ti), tungsten (W), cobalt (Co), copper (Cu), tantalum (Ta), platinum (Pt), molybdenum (Mo), silver (Ag), gold (Au), manganese (Mn), zirconium (Zr), ruthenium (Ru), or other conductive materials, or combinations thereof. In the present embodiment, second interconnect structure 318 is formed of tungsten (W) or a compound containing W, and is formed using deposition processes such as PVD, CVD or any suitable deposition process. Method 200 may then perform a planarization process such as a chemical-mechanical polishing (CMP) process to remove any excess material from a top surface of ILD 312 and second interconnect structure 318 such that second interconnect structure 318 is fully exposed on a top surface.

In a non-limiting example during which method 200 was utilized for forming the middle-of-line interconnect structure, the rivet-shaped void extends in a lateral direction for a first distance of about 8~10 nm and in a vertical direction for a second distance of about 7~9 nm. When filled with the second interconnect structure material, the lateral distance being larger than the vertical distance effectively secures the interconnect knob in place such that when undergoing planarization, there is a decreased risk of pull-up of the plug while ensuring that punch through to underlying layers does not occur. For example, such a larger lateral portion of the interconnect knob, that extends below the upper layers (e.g., 304, 312), can prevent the interconnect knob from being pulled up. Further, even though there is slurry (or otherwise small sized by-products) penetrating through the upper layers while undergoing planarization, the larger lateral portion of the interconnect knob can advantageously block the slurry from reaching the underlying interconnect structure (e.g., 302).

Method 200 may proceed to step 212, or may perform additional steps to complete fabrication of semiconductor device 300. For example, additional vertical interconnect features such as contacts, vias, horizontal interconnect features such as lines, and multilayer interconnect features such as metal layers and interlayer dielectrics can be formed over semiconductor 300. The various interconnect features may implement conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. Semiconductor device 300 may be included in a microprocessor, a memory, and/or other integrated circuit device. Semiconductor device 300 may be a portion of an IC chip, a system on a chip (SoC), or portion thereof that includes various passive and active microelectronics devices such as resistors, capacitors, inductors, diodes, MOSFET, complementary metal-oxide semiconductors (CMOS) transistors, bipolar junction transistors (BJTs), laterally diffused MOS (LDMOS) transistors, high voltage transistors, high frequency transistors, other suitable components, or combinations thereof.

Figure 4:
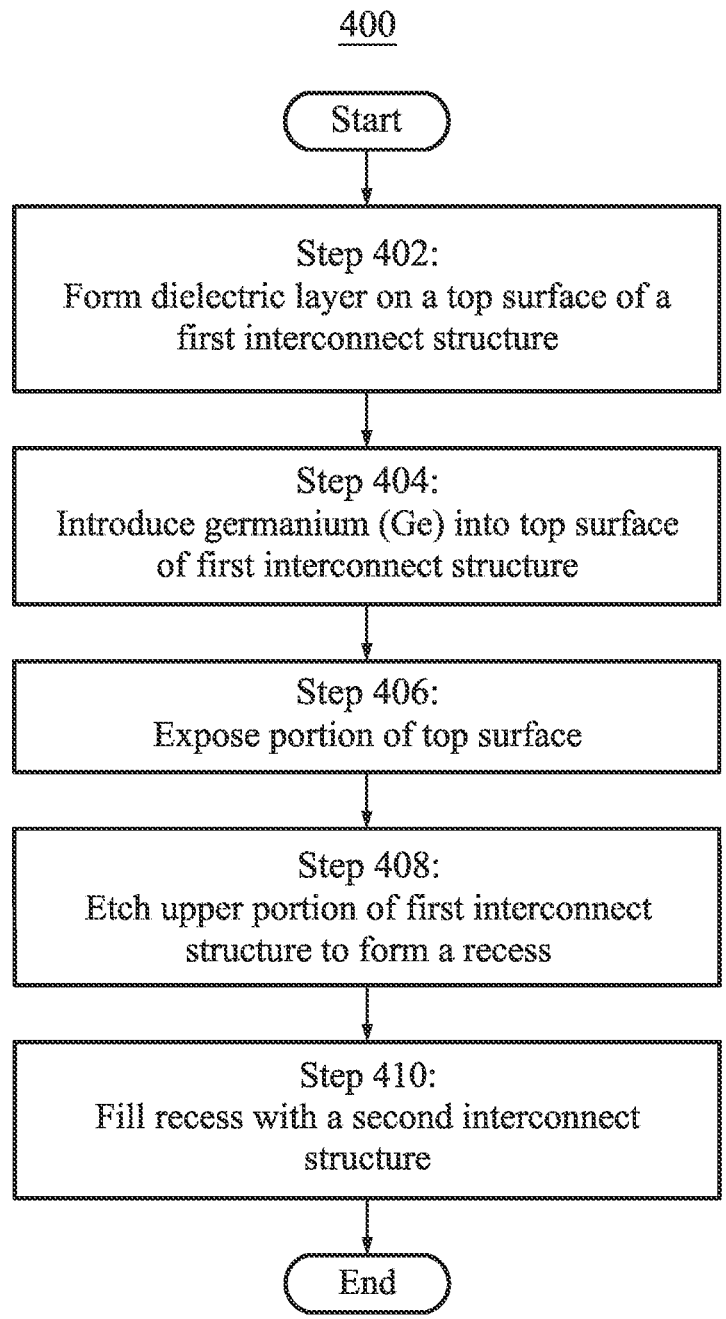
FIG. 4 illustrates a flow chart of another example method for fabricating the middle-of-line interconnect structure of FIG. 1, in accordance with some embodiments.

FIG. 4 illustrates an alternative flow chart of a method 400 for fabricating the middle-of-line interconnect structure of FIG. 1, in accordance with some embodiments. Method 400 is substantially similar to that of method 200 described with reference to FIG. 2. For these reasons, only the differences between method 200 and method 400 will be described with reference to FIG. 4.

Method 400 begins with a step 402 in which a dielectric layer is formed on a top surface of a first interconnect structure. The first interconnect structure is substantially composed of cobalt (Co) in the present embodiment, but may include other electrically conductive materials suitable for use in the interconnect, such as copper (Cu), tungsten (W), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The dielectric layer may be an interlayer dielectric material including a suitable material such undoped silicate glass, or doped silicon oxide such as borophosphosilicate glass (BPSG), fused silica glass (FSG), phosphosilicate glass (PSG), boron doped silicon glass (BSG), low-k dielectric material and/or other suitable dielectric materials such as an oxide, a nitride, a carbide, an oxynitride, other suitable dielectric material, or combinations thereof. In the present embodiment, the dielectric layer includes silicon oxide, silicon nitride, silicon carbide, silicon oxynitride, other suitable silicon-containing materials, or combinations thereof, and more specifically $Si_3N_4$. The dielectric layer is formed using any suitable method such as spin-on coating, flowable CVD, CVD, PVD, other suitable methods, or combinations thereof. The dielectric layer is substantially similar in form and function to ILD layer 114 described with reference to FIG. 1 and/or ILD layer 312 described with reference to FIGS. 3B through 3F. In method 400, step 402 occurs without deposition of a metal contact-etch-stop layer (MCESL) occurring first; a MCESL provides an added benefit of being resistant to chemical etching than a dielectric layer, but similar results to those described above with reference to FIGS. 2 and 3A through 3F can be achieve using only a dielectric layer.

Method 400 continues with a step 404, in which germanium (Ge) is introduced to a top surface of the first interconnect structure directly beneath the dielectric layer. Ge is introduced to the top surface of the first interconnect structure via an ion implantation process, in which Ge ions are implanted to a concentration between about 5e14 $cm^{-3}$ and about 2e15 $cm^{-3}$. During step 404, a gas such as GeF4 is ionized to form a plasma including Ge ions to be implanted into the top surface. The Ge ions are implanted to a depth about equal to or greater than the vertical height of the dielectric layer deposited in step 402 such that a region including both cobalt (Co) and Ge is distributed along a top surface of the first interconnect structure. When the Ge ions are implanted, the etch characteristics of the first interconnect structure are altered in the region containing Ge.

Method 400 continues with a step 406, in which a portion of the top surface of the first interconnect structure is exposed. This can be achieved by selectively etching a corresponding portion of the dielectric layer to form a via that exposes the portion of the top surface in which the Ge ions were implanted. The etching process may include wet etching, dry etching, reactive ion etching (RIE), or other suitable etching methods.

In some embodiments, similar to step 208 described with reference to FIG. 2, step 406 includes a series of patterning processes that takes place prior to etching of the dielectric layer. The patterning processes may include forming a resist layer (e.g., a photo-resist layer; not shown), which may further include one or more underlying layers (e.g., hard mask layer and/or a bottom anti-reflective coating (BARC) layer), exposing the photoresist layer, baking the exposed resist layer, developing the exposed resist layer, and subsequently etching the under-lying layers using the patterned resist layer as an etch mask. In some embodiments, a hard mask layer is formed over a top surface of the dielectric layer (e.g., ILD layer 312) prior to forming the patterned photoresist layer. The hard mask layer may be a nitride-containing layer such as titanium nitride. After etching, the patterned photoresist layer may be subsequently removed using any suitable method such as plasma ashing.

Method 400 continues with a step 408 in which an upper portion of the first interconnect structure is etched to form a recess. An etching process such as wet etching, dry etching, reactive ion etching (RIE), or another suitable etching method may be used to form the recess. In the embodiment of FIG. 4, the etching method is a wet etch process in which the cobalt of the first interconnect structure is converted into $CoF_x$, which dissolves in water, using hydrofluoric acid (HF) or the like.

Method 400 continues with a step 410, in which the recess is filled with a second interconnect structure. In the present embodiment, the second interconnect structure is formed substantially of tungsten (W), but in various embodiments may include other conductive metals such as copper (Cu), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The second interconnect structure is formed to be in contact with the first interconnect structure, such that an electrical signal may pass from the first interconnect structure to the second interconnect structure and vice versa. The second interconnect structure is formed in a manner substantially similar to that of second interconnect structure 318 described with reference to FIG. 3F. Method 400 may then perform a planarization process such as a chemical-mechanical polishing (CMP) process to remove any excess material from a top surface of the dielectric layer and the second interconnect structure such that a top surface of the second interconnect structure is fully exposed.

Method 400 may conclude with step 410, or may perform additional steps to complete fabrication of the semiconductor device in which the second interconnect structure is disposed. For example, additional vertical interconnect features such as contacts, vias, horizontal interconnect features such as lines, and multilayer interconnect features such as metal layers and interlayer dielectrics can be formed over semiconductor 300. The various interconnect features may implement conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The semiconductor device may be included in a microprocessor, a memory, and/or other integrated circuit device. Semiconductor device 300 may be a portion of an IC chip, a system on a chip (SoC), or portion thereof that includes various passive and active microelectronics devices such as resistors, capacitors, inductors, diodes, MOSFET, complementary metal-oxide semiconductors (CMOS) transistors, bipolar junction transistors (BJTs), laterally diffused MOS (LDMOS) transistors, high voltage transistors, high frequency transistors, other suitable components, or combinations thereof.

The interconnect structure provided by the anisotropic etching is to form a rivet profile sufficient to effectively prevent slurry leakage and pull-up of the interconnect. The solution disclosed herein decreases the amount of pull-up instances due to the lateral enlargement of the knob while also preventing unintentional punch through of the interconnect layer by maintaining a lower vertical etch rate. In adding the dopant-type element to the interconnect layer (e.g., germanium to the cobalt layer), the etch characteristics of the interconnect layer differ only in the implanted region deposited horizontally along the top surface of the interconnect layer to increase etching in a lateral direction, such that a greater lateral profile of the knob is achieved.

In one aspect of the present disclosure, a method for manufacturing a semiconductor device is disclosed. The method includes introducing germanium (Ge) into a top surface of a first interconnect structure, the first interconnect structure including cobalt (Co). The method includes exposing a portion of the top surface. The method includes recessing an upper portion of the first interconnect structure such that the recessed upper portion of the first interconnect structure laterally extends a first distance along the top surface and vertically extends a second distance into the first interconnect structure.

In another aspect of the present disclosure, a method for manufacturing a semiconductor device is disclosed. The method includes forming, near a surface of a first interconnect structure comprised of a first metal, a region of varied composition including the first metal and a second element. The method includes forming, within the region of varied composition, a recess, the recess laterally extending a first distance along the surface and vertically extending a second distance below the first surface. The method includes filling the recess with a second metal to form a second interconnect structure that contacts the first interconnect structure.

In yet another aspect of the present disclosure, a semiconductor device is disclosed. The semiconductor device includes a first interconnect structure formed of a first metal and having a first horizontal top surface along which germanium is distributed. The semiconductor device includes a second interconnect structure formed of a second metal and in contact with the first interconnect structure. The second interconnect structure includes a first portion disposed above the horizontal top surface of the first interconnect structure. The second interconnect structure includes a second portion disposed below the horizontal top surface and laterally extending beyond sidewalls of the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
   introducing germanium (Ge) into a top surface of a first interconnect structure, wherein the first interconnect structure comprises cobalt (Co);
   exposing a portion of the top surface; and
   recessing an upper portion of the first interconnect structure, wherein the recessed upper portion of the first interconnect structure laterally extends a first distance along the top surface and vertically extends a second distance into the first interconnect structure.

2. The method of claim 1, further comprising forming a dielectric layer that comprises $Si_3N_4$ on the top surface of the first interconnect structure prior to the step of introducing Ge.

3. The method of claim 1, wherein the step of exposing a portion of the top surface comprises etching an interlayer dielectric disposed over the first interconnect structure to form a vertical recess extending through the interlayer dielectric.

4. The method of claim 3, further comprising forming a second interconnect structure in the vertical recess and the recessed upper portion, wherein the second interconnect structure comprises tungsten (W).

5. The method of claim 1, wherein the step of introducing Ge comprises implanting germanium ions into the top surface via ion implantation.

6. The method of claim 5, wherein the germanium is implanted to a concentration between about $5e14$ $cm^{-3}$ and about $2e15$ $cm^{-3}$.

7. The method of claim 1, wherein the first distance is about 10 nanometers (nm).

8. The method of claim 1, wherein the second distance is about 8 nanometers (nm).

9. A method for making a semiconductor device, comprising:
   forming, near a surface of a first interconnect structure comprised of a first metal, a region of varied composition including the first metal and a second element;
   forming a recess within the region of varied composition, wherein the recess laterally extends a first distance along the surface and vertically extends a second distance below the surface; and
   filling the recess with a second metal to form a second interconnect structure that contacts the first interconnect structure.

10. The method of claim 9, wherein the second element is germanium (Ge).

11. The method of claim 9, wherein the first metal is cobalt (Co) and the second metal is tungsten (W).

12. The method of claim 9 further comprising depositing a dielectric layer comprising silicon nitride ($Si_3N_4$) on the surface of the first interconnect structure prior to the step of forming the region of varied composition.

13. The method of claim 12 further comprising etching a vertical recess into the dielectric layer to expose a portion of the region of varied composition prior to the step of forming the recess.

14. The method of claim 13, wherein the step of filling the recess with a second metal to form a second interconnect structure further comprises filling the vertical recess with the second metal.

15. The method of claim 9, wherein forming the region of varied composition comprises implanting, via ion implantation, ions of the second element to a concentration between about $5e14$ $cm^{-3}$ and about $2e15$ $cm^{-3}$.

16. The method of claim 9, wherein the first distance is about 10 nanometers (nm) and the second distance is about 8 nanometers (nm).

* * * * *